(12) United States Patent
Rantala

(10) Patent No.: US 10,104,740 B2
(45) Date of Patent: Oct. 16, 2018

(54) LED STRUCTURE WITH A DYNAMIC SPECTRUM AND A METHOD

(71) Applicant: Juha Rantala, Bäch (CH)

(72) Inventor: Juha Rantala, Bäch (CH)

( * ) Notice: Subject to any disclaimer, the term of this patent is extended or adjusted under 35 U.S.C. 154(b) by 0 days.

(21) Appl. No.: 15/617,442

(22) Filed: Jun. 8, 2017

(65) Prior Publication Data
US 2018/0092182 A1    Mar. 29, 2018

Related U.S. Application Data

(63) Continuation of application No. 14/710,627, filed on May 13, 2015, now Pat. No. 9,681,515.

(51) Int. Cl.
| | | |
|---|---|---|
| *G05F 1/00* | (2006.01) | |
| *H05B 37/02* | (2006.01) | |
| *H05B 39/04* | (2006.01) | |
| *H05B 41/36* | (2006.01) | |
| *H05B 33/08* | (2006.01) | |

(Continued)

(52) U.S. Cl.
CPC ......... *H05B 33/0857* (2013.01); *A01G 7/045* (2013.01); *A01G 9/20* (2013.01); *H01L 25/0753* (2013.01); *H01L 33/504* (2013.01); *H01L 2933/0041* (2013.01)

(58) Field of Classification Search
CPC ...... A01G 7/045; A01G 9/20; H01L 25/0753; H01L 33/504
See application file for complete search history.

(56) References Cited

U.S. PATENT DOCUMENTS

| | | |
|---|---|---|
| 5,012,609 A | 5/1991 | Ignatius et al. |
| 5,278,432 A | 1/1994 | Ignatius et al. |

(Continued)

FOREIGN PATENT DOCUMENTS

| | | |
|---|---|---|
| CA | 2856725 A1 | 6/2013 |
| CN | 201797809 U | 4/2011 |

(Continued)

OTHER PUBLICATIONS

Argyroudi-Akoyunoglou et al: Photoinduced Changes in the Chlorophyll a to Chlorophyll b Ratio in Young Bean Plants. Plant Physiology. 247-9, 1970.

(Continued)

*Primary Examiner* — Anh Tran
(74) *Attorney, Agent, or Firm* — Lewis & Reese, PLLC

(57) ABSTRACT

An integrated LED structure and a method of adjusting the emission spectrum of an integrated LED structure, for photobiological process. The structure comprises a substrate; a plurality of optically isolated and electrically non-independent light emission areas integrated on the substrate; a light emitting semiconductor source of a first type mounted in the emission area(s); a light emitting semiconductor source of a second type mounted in the emission area(s); an electrical circuit layer for connecting the said light emitting semiconductor sources in serial fashion for each emission area; and wavelength conversion materials. The emission areas are controlled with a common electrical drive current, and the emission output can be tuned by adjusting the common current value, to enable use of one luminaire for a large variety of biomass growing applications.

27 Claims, 3 Drawing Sheets

(51) Int. Cl.
*A01G 7/04* (2006.01)
*A01G 9/20* (2006.01)
*H01L 25/075* (2006.01)
*H01L 33/50* (2010.01)

(56) References Cited

U.S. PATENT DOCUMENTS

| | | | |
|---|---|---|---|
| 8,074,397 B2 * | 12/2011 | Yoneda | A01G 7/045 47/1.01 R |
| 8,297,782 B2 * | 10/2012 | Bafetti | F21V 23/003 362/231 |
| 8,302,346 B2 | 11/2012 | Hunt et al. | |
| 8,453,376 B2 * | 6/2013 | Chen | A01G 7/045 47/58.1 LS |
| 9,681,515 B2 * | 6/2017 | Rantala | H05B 33/0857 |
| 2006/0261742 A1 | 11/2006 | Ng et al. | |
| 2010/0244724 A1 | 9/2010 | Jacobs et al. | |
| 2013/0139437 A1 * | 6/2013 | Maxik | H05B 37/02 47/58.1 LS |
| 2013/0194795 A1 * | 8/2013 | Onaka | F21V 5/04 362/231 |
| 2013/0318869 A1 | 12/2013 | Aikala | |
| 2014/0034991 A1 | 2/2014 | McKenzie et al. | |
| 2014/0152194 A1 | 6/2014 | Beyer | |

FOREIGN PATENT DOCUMENTS

| | | |
|---|---|---|
| CN | 103947469 A | 7/2014 |
| CN | 103947470 A | 7/2014 |
| JP | S6420034 A | 1/1989 |
| WO | WO02067660 A1 | 9/2002 |
| WO | WO2009045107 A1 | 4/2009 |
| WO | WO2013141824 A1 | 9/2013 |
| WO | WO2014188303 A1 | 11/2014 |

OTHER PUBLICATIONS

Beelman & Kalaras: Post-harvest Vitamin D Enrichment of Fresh Mushrooms. HAL Project# MU07018 (Apr. 30, 2009), Penn State University.
Carvalho et al: Sequential light programs shape kale (*Brassica napus*) sprout appearance and alter metabolic and nutrient content. Horticulture Research (2014) 1, 8.
Eytan et al: Changes in photosystem i activity and membrane organization during degreening and greening of a chlamydomon as reinhardi mutant, y-1. J. Biol. Chem. p. 738-744. 1974.
Klueter et al: Photosynthesis in Cucumbers with Pulsed or Continuous Light. Transactions of the ASABE. 23(2): 0437-0442. 1980.
Lefsrud et al: Irradiance from distinct wavelength light-emitting diodes affect secondary metabolites in kale. HortScience 43:2243-2244, 2008.
Nicklish A: Growth and light absorption of some planktonic cyanobacteria, diatoms and chlorophyceae under simulated natural light fluctuations. J. Plankton Res. 20:105-119.
Olle et al: The effects of light-emitting diode lighting on greenhouse plant growl and quality. Agricultural and Food Science, 22:223-234, 2013.
Sforza et al: Adjusted Light and Dark Cycles Can Optimize Photosynthetic Efficiency in Algae Growing in Photobioreactors. PLoS ONE 7(6): e38975, 2012.
Tennessen et al: Efficiency of photosynthesis in continuous and pulsed light emitting diode irradiation. Photosynthesis Research 44: 26 1-269, 1995.
Vänninen et al: Prospecting the use of artificial lighting for integrated pest management. ISHS Acta Horticulturae 1, 593-608, 2010.
Yeh, et al: High-brightness LEDs—Energy efficient lighting sources and their potential in indoor plant cultivation. Renewable and Sustainable Energy Reviews 13: 2175-2180, 2009.

* cited by examiner

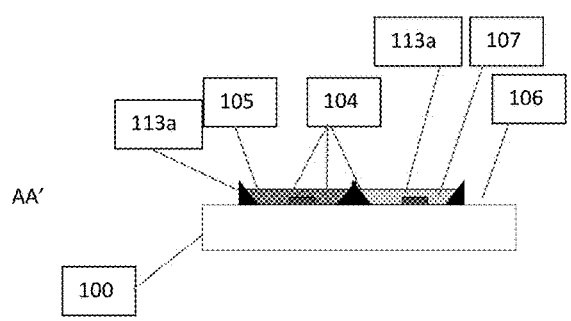
Fig. 3
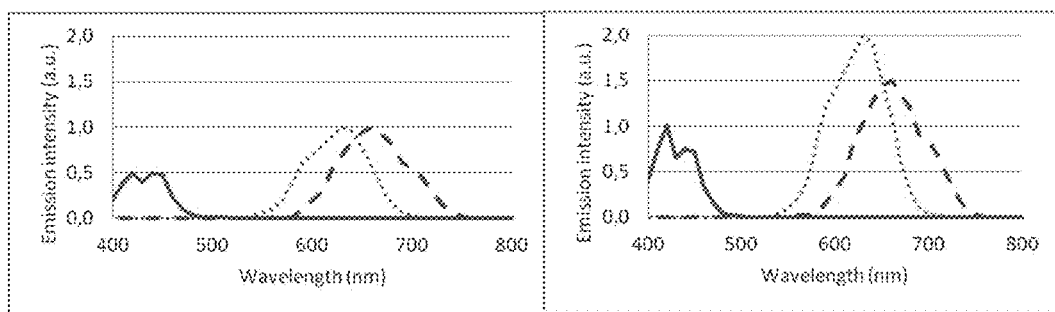
Fig. 4A  Fig. 4B

LED STRUCTURE WITH A DYNAMIC SPECTRUM AND A METHOD

FIELD OF INVENTION

The present invention relates to artificial lighting arrangements and methods used in agriculture, horticulture and in biomass growing industry. In particular, the present invention relates to the field of optoelectronics and photobiology. The present invention relates to use of an integrated LED structure and a method in grow lights.

BACKGROUND ART

Greenhouse industry is experiencing an era of rapidly advancing technologies for artificial illumination. LED based luminaries have entered commercial use as grow lights relatively recently. HPS and conventional arc light sources are now moving aside and more efficient LED luminaries are emerging into markets including advanced functionalities e.g. integrated pest management (Vanninen et al., 2012).

However, the potential modes of LEDs for illuminating plants are still rarely fully optimized. Currently used LED based luminaries still suffer low efficiency and provide emission spectra not well overlapping with the absorption spectra of photobiological processes such as photosynthesis. Over-exposing of plants with high intensity sources and lack of advanced control modes such as pulsed illumination are still topics not fully researched or solved in practice. A LED spectrum can be matched with photobiological requirements to enhance plants' growth and to increase the total organic output i.e. the harvested volume of a greenhouse products e.g. tomatoes or lettuce.

Photobiological requirements are mainly defined by the absorption spectrum of the photosynthesis and other photobiological processes in question.

There is also a need to meet the timing requirements of the illumination when operating with a pulsed light. The timing requirement arises from the chlorophyll B excitation and electron transfer delay to the chlorophyll A associated process and the potential to optimize the energy usage for driving the photosynthesis. Other natural parameters that account for the illumination requirements include e.g. partial pressure of carbon dioxide, irrigation level of soil, temperature and type of canopy. Other requirements that constitute to the required illumination spectrum may arise e.g. from marketing motives to grow vegetables with certain skin colors or the need to enhance the product's nutrition content or other effective substance.

Different plants and biomass applications require slightly differing type of illumination conditions to reach optimal growth. This induces greenhouse industry to invest on many types of artificial grow lights. It is the objective of the disclosed invention to provide an integrated LED structure with adjustable emission characteristics to meet the different requirements of various biomass growing applications.

A good example is e.g. the growth of red and black soybeans. According to CN103947470A and CN103947469 particular light spectrum conditions are preferred for optimum growth of red and black soyabeans, with rough blue, red, and yellow spectrum band ratios being 3:1:5 and 4:3:3 respectively, demonstrating the need for adjustable spectrum type light source to enable one artificial grow light to be used with a variety of different plants. Similarly for example tomato plant and spruce require quite different type of light to grow efficiently. The required spectrum components also vary between different growing cycles of a same plant e.g. during vegetation phase blue rich light is preferred, and flowering and fruit grow phases are typically connected with red rich light. Another requirement for adjusting the spectrum of the grow light is the need to grow e.g. vegetables with varying skin colors of e.g. bell paprika for marketing purposes or for enhancing certain nutrition components in the paprika fruit.

A grow light with adjustable spectrum would also allow new functionalities not yet fully exploited in the greenhouse industry. For example it is known that a pre-harvesting treatment of kale affects strongly on the nutrition content (Carvalho et al., 2014; Lefsrud et al., 2008). Another example is the UV flash-treatment of cultivated mushrooms prior harvesting or post harvesting to enrich their vitamin D content (Beelman et al., 2009).

Another example of potential benefits of a source with an adjustable emission spectrum becomes apparent when considering biomass growth applications such as algae (Nicklish, 1998). The absorption spectrum shifts from around 680 nm peak towards lower wavelength peak around 630 nm when the photoperiod becomes shorter. Similar shift in absorbance is documented in the literature (Eytan, 1974). The ratio of chlorophyll A and chlorophyll B concentration has been shown to change in time when plant is subjected to continuous illumination as e.g. in case of Red Kidney bean plants (Argyroudi-Akoyunoglou, 1970). Such change presupposes an alteration in the emission spectrum to maintain optimum growth conditions.

It is clear that the grow light should allow flexible modification of spectrum characteristics to enable its use for growing different types of plants and even modifying spectrum characteristics during the different growth phases. These requirements combined with the idea of growing biomass with a pulsed light source are now tackled with the disclosed invention.

Two main approaches exist to build a LED source for luminaries used as grow lights.

In the first approach, the emission spectrum can be generated by combining optical output of different color discreet LEDs. This type of hybridized LED structure is often called an RGB LED. In this approach the LEDs are discreet LED components and e.g. blue-red emissions have clearly distinct spatial source points. The light is produced within the compound semiconductor pn-junction while the emission spectrum from a single pn-junction is relatively narrow, typically only 10 to 40 nm. Due to narrow emission spectrum several semiconductor chips are used in combination to provide the required wider spectrum to fully cover the red and blue wavelength bands of the visible spectrum required by e.g. photosynthesis. The required semiconductor chips can be packaged discreetly or mounted inside a same package however optically forming still a large source point.

In the second approach the emission spectrum is generated within a single LED package. In this case one or several LED semiconductor chips excite wavelength conversion material or typically a phosphor material layer to generate continuous emission spectrum matching closely with the photobiological requirements. For example 425 nm LEDs chip excite an appropriately selected phosphor material layer and can provide typical double peak spectrum offering a relatively good match with the above explained requirements with the primary photobiological process of photosynthesis. One such phosphor material is based on nitridoaluminates and provides an narrow band emission spectrum with full width half maximum being only 50 nm or less and matching well the absorption spectrum of chlorophyll molecules.

In short, commercial light sources, being LED, fluorescent or HPS, all still commonly apply continuous light with fixed optical spectrum. It is known that it would be beneficial to apply pulsed light to firstly save energy and secondly to apply light source that would enable spectrum adjustment to meet changing spectral requirements during the plant growth cycles, or phase of photosynthesis, or to allow use of same luminaire supporting varying light requirements. Pulsed light arrangement has been shown to benefit also algae growth (Sforza et al, 2012).

PPF (photosynthetic photon flux) should be kept at level similar or equal to sun light level that is roughly 2000 $\mu mols/m^2/s$ to avoid excess light and stressing plants. Now this applies for continuous light. With pulsed light the situation changes as the dark cycle can be adjusted so that the photobiological process has time to 'use' the light energy absorbed during the light cycle. Thus the maximum light intensity can be increased substantially from nominal sun light level of 2000 $\mu mols/m^2/s$ e.g. to 10000 $\mu mols/m^2/s$ to allow even faster growth. However, such arrangements presumes considering the excess heat from the light source, other growth limiting parameters such as the level of carbon dioxide, and also how to avoid self-shadowing from the canopy to best utilize high intensity source.

Artificial grow lights have been under research and delopment for decades (Olle et al., 2013; Klueter et al. 1980; Yeh et al. 2009). Also pulsed light sources have been introduced earlier (JPS6420034A). This source was based on discharge lamps and was able to produce pulse lengths between 1 to 50 ms. This early innovation was impaired by the fact that the discharge lamps did not meet well the required spectrum characteristics as large part of the light energy is emitted at wavelengths not needed by photobiological processes. Furthermore, the pulse lengths were not short enough to fully exploit the benefits of pulsed light.

A study carried out by Tennesen with co-workers (Tennessen et al, 1995) shows the benefits of pulsed light. In this study the pulse period of 100 $\mu s$ and dark periods of few ms were used. The experimental light source was assembled from discreet LED components emitting at narrow fixed wavelength bands of 658/668 nm only.

First pulsed grow light based on LEDs appears in U.S. Pat. No. 5,012,609 (Ignatius). This approach was based on discreet emitters for each required wavelength band i.e. 400-500, 620-680, and 700-760 nm. The driving circuit was able to produce pulses in duration of 100 $\mu s$, i.e. at optimum length. However, the driving circuit was based on current-limiting-resistor and is considered to have a modest energy efficiency when compared to modern solutions such as the one disclosed in the disclosed invention. The main drawback of the approach was that it did not provide means to adjust the spectrum for different growth cycles. The spectrum was fixed as the discreet visible range wavelength emitters were all required to be in the same serial-parallel circuit.

U.S. Pat. No. 5,278,432 (Ignatius) presents some innovations on the packaging and mounting of discreet LEDs on heat sinking substrate. However, driver circuit is still in the form of current-limiting-resistor and the spectrum is fixed with all emitters coupled in series-parallel fashion, excluding the possibility to somehow control the intensity at certain wavelength bands or to adjust the emission spectrum.

WO 02/067660 discloses a system level arrangement of red and white light LEDs to optimize the emitted spectrum to speed-up the plant growth. In the disclosed structure the spectrum is fixed after the discreet LEDs have been mounted on the carrier substrate. It is clear from this and later publications discussed below that the pulsed light is preferred mode of operation to reduce the total growth time.

The AC driver arrangement disclosed in US2010/244724 (Philips) provides means to reduce total cost of the system by applying same driver circuit for two discreet light sources, emitting in opposite phases of the sinusoidal AC current. Obvious issue becoming the spatial separation of the two LED strings to avoid over exposing the plants under and to gain the benefits of the pulsed lighting.

U.S. Pat. No. 8,302,346 (UoG) discloses a growth enhancing system with a feedback based arrangement applying pulsed light source based again on discreet LED chips each emitting a fixed spectrum.

CN 201797809 discloses light source arrangement that applies discreet LED emitters to form the required total spectrum including UV, UVB, blue and near IR.

CN103947470 and CN103947469 disclose light spectrum conditions preferred for optimum growth of black and red soyabeans, with rough blue, red, and yellow spectrum band ratios being 3:1:5 and 4:3:3 respectively, demonstrating the need for adjustable spectrum type light source to enable wider use for growth of different plants.

CA 2,856,725 discloses hybridized light source arrangement that would allow spectrum tunability and pulsed operation mode to prevent photosynthesis saturation. However, the presented light source structure has a system level approach based on discreet LED components mounted on printed circuit board with different emission wavelengths, and with a fixed ratio of LED emitters at individual wavelength ranges to create required spectrum. The expensive feedback system approach based on absorption and/or fluorescence sensing gives coarse feedback to allow tuning of intensity, and of the light on and off periods i.e. the light patterns. However, as the absorption of other than chlorophyll molecules such as carotenin molecules, play important role in 'plant's' heat sinking capability, and effectively large part of light energy is wasted when absorbance is used as a feedback.

WO 20014/188303 discloses means for enhancing plant growth by adjusting the ratio of blue and red lights alone. US 2014/152194 (Beyer) discloses another system to be able to provide necessary spectrum bands for enhancing the growth.

US 2013/318869 has fixed intensity ratios of characteristic peaks at wavelength bands of 400-500 nm (blue), 500-600 nm (green), 600-800 nm (red), and with 500-600 nm band to have lower intensity compared to other two. However, the said arrangement does not allow adjusting the ratio between the intensities of the said blue and red wavelength bands.

US 2014/034991 and US 2006/261742 both disclose similar LED arrangement to each other that enable the tuning of the color coordinates and thus the chromaticity of the light emitted from the LED arrangement. However, these arrangements are not addressing the requirements of biomass growing applications or e.g. pulsed light operation. The emission spectrum is not meeting the photobiological requirements. The operation is defined to be continuous, while not meeting the requirement of having alternating emission spectrum of pulsed type.

WO2013141824 discloses a similar LED arrangement that enables tuning of the spectrum for matching with the chlorophyll b and a absorbance. However, the arrangement is not addressing other requirements of biomass growing applications such as the pulsed light operation. The operation is defined to be continuous failing to benefit from alternating emission spectrum.

SUMMARY OF INVENTION

It is an aim of the present invention to provide a device for achieving biomass growth.

It is another aim of the present invention to provide a method of achieving biomass growth.

It is a further aim of the present invention to provide a method of adjustment of luminaire emission spectrum to allow for predetermined artificial illumination for different applications in greenhouses or for different growth cycle phases of a same plant.

It is still a further aim of the invention to provide new uses for grow lights.

It is still a further aim of the invention to provide a method of illumination using an integrated light emitting diode (LED) structure with an adjustable emission spectrum and ability to support pulsed light emission.

The present invention provides an LED structure comprised of a substrate, a plurality of optically isolated and electrically non-independent light emission areas integrated on the substrate, a light emitting semiconductor source of a first type mounted in the emission area(s), and a light emitting semiconductor source of a second type mounted in the emission area(s). The LED structure further comprises an electrical circuit layer for connecting the light emitting semiconductor sources in serial fashion for each emission area, and a wavelength conversion material of the first type formed on the top of the said first type of light emitting semiconductor sources and a wavelength conversion material of the second type formed on the top of the said second type of light emitting semiconductor sources.

The present invention also provides a method of adjusting the emission spectrum of the integrated LED structure for photobiological processes comprising the steps of generating the emission output by supplying a common current to the semiconductor light emitting sources in the LED structure; tuning the emission spectrum's multiple intensity peaks to a nominal operating point by adjusting the common current value to a mid value range; and tuning the emission spectrum's multiple peaks' intensity ratios within the full range by adjusting common current from a minimum value to a maximum value.

The method allows for selecting applications requiring emission spectrum with equal intensity between 620 and 640 nm and between 650 and 670 nm by tuning the common current to a low value within the operating range of the integrated LED structure.

The method also allows for selecting application requiring emission spectrum with high intensity between 620 and 640 nm and low intensity between 650 and 670 nm by tuning the common current to a high value within the operating range of the integrated LED structure.

Finally, the method allows for selecting application requiring emission spectrum with low intensity between 620 and 640 nm and high intensity between 650 and 670 nm by tuning the common current to a low value within the operating range of the said integrated LED structure.

Typically, the "low value" of the common current is at least 10%, preferably at least 20%, in particular 30 to 80%, lower than the mid value of the common current in the range from said minimum value to said maximum value, and the "high value" of the common current is at least 10%, preferably at least 20%, in particular 30 to 80%, higher than the mid value of the common current in the range from said minimum value to said maximum value.

Considerable advantages are obtained by the present technology.

Thus, the disclosed integrated LED structure finds use in grow light systems previously presented in the art, for example in WO 2013/141824 and WO 2009/045107. The disclosed integrated LED structure perfectly suits grow light systems that are applying various sensors for $CO_2$, soil humidity, canopy height, or growth phase to control the illumination by the feedback from the plants and require dynamic luminaries with adjustable spectrum, tunable intensity and controllable pulse mode operation.

The disclosed invention also provides an integrated LED structure that enables flexible usage of one luminaire for a large variety of biomass growing applications. The integrated LED structure, with densely packed emission areas, produces high spectral uniformity in the far field, which is difficult to produce with e.g. a discreet LED approach.

Thus, the present integrated LED structure with adjustable emission characteristics will meet the different requirements of various biomass growing applications.

No expensive feedback system is needed in the present technology; rather a system approach has been adopted that is based on preset or programmable pulse patterns.

BRIEF DESCRIPTION OF DRAWINGS

Embodiments of the present invention will now be further described, by way of non-limiting example, with reference to the accompanying diagrammatic drawings.

In the drawings:

FIG. 3 Is a schematic view of the cross-section of an integrated LED structure according to an embodiment of the present invention.

FIGS. 4A and 4B Show graphs representing a typical emission spectrum of an integrated LED structure according to an embodiment of the present invention.

DESCRIPTION OF EMBODIMENTS

Figure 1:
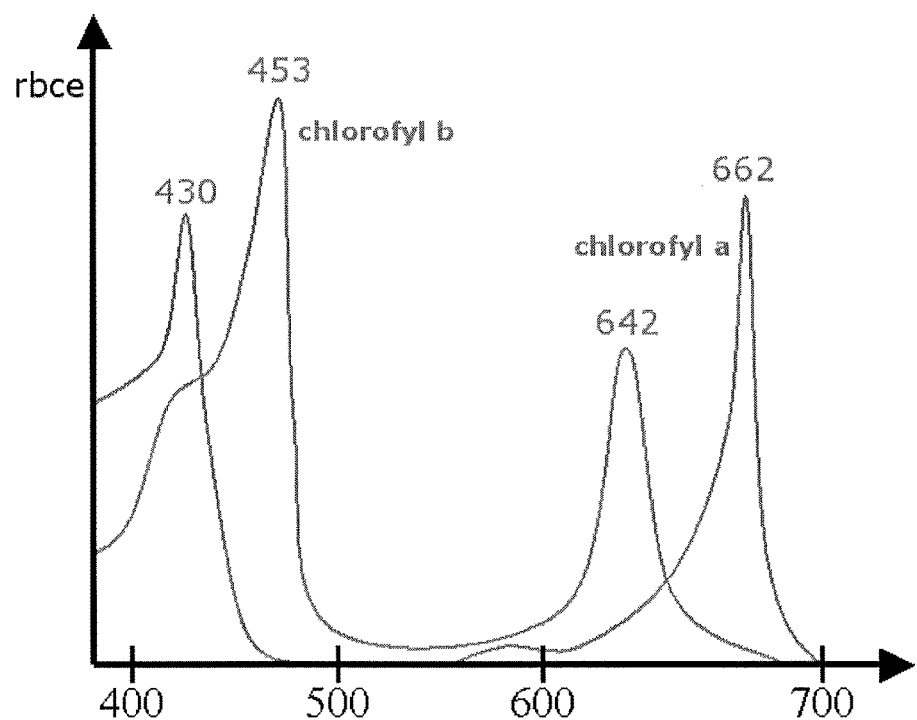
FIG. 1 Is a graph representing the relative absorption spectra of chlorophyll A and chlorophyll B molecules in the wavelength range from 400 nm to 700 nm.

The following descriptions are merely non-limiting examples and it will be appreciated by one skilled in the art that specific details of the examples may be changed without departing from the spirit of the invention.

It is an aspect of certain embodiments to provide an integrated LED structure comprising; a substrate, at least one or a plurality of isolated emission areas, and an electrical two wire control interface.

In one embodiment, the isolated emission areas comprise one or multiple LED semiconductor diodes as light emitters to provide light emission. In preferred embodiments the emitters are of different type and have emission peaks between 365 to 440 nm.

The light emitters are electrically connected in series to enable a common current drive scheme. The control interface has at least one wire for providing the common drive current and least one ground wire to close the current path back to power supply.

One or multiple isolated emission areas comprise wavelength conversion materials to provide means for light emission with wider bandwidth. One or plurality of isolated emission areas can comprise in some preferred embodiment more than one type of wavelength conversion materials layered vertically upon each other.

In preferred embodiments the wavelength conversion material is a narrow band phosphor based e.g. on nitridoaluminates materials providing emission spectrum with full width half maximum of 40 to 80 nm.

The isolated emission areas can be formed as buried shallow cavities on the top surface of the said substrate. Alternatively, the isolated emission areas can be formed by manufacturing an optically opaque mesa structure between the emission areas. In some preferred embodiments the LED structure can comprise both buried shallow cavities and isolated emission areas surrounded by opaque mesa structure. In some preferred embodiments the LED structure can comprise several emission areas in buried cavities of different heights.

The emission spectrum is formed of emissions from different emission areas at wavelength bands with at least some of them in blue (365-440 nm) and red (600-780 nm) bands and optionally having one or multiple emission bands in wavelength bands of ultra-violet (UV), green, red and near-infra red to complement the emission spectrum.

In some embodiments the emission side of the integrated LED structure can be equipped optionally with a polarizer to provide polarized light depending again the lighting and application requirements. The said polarizer can cover all or some of the emissions areas.

An embodiment comprises using an integrated LED structure, which has two different type of semiconductor emitters coupled in series and which is driven with a common current signal. The light emitters have different current-to-light conversion due to different thermal characteristics. This results in asymmetric excitation of the wavelength conversion material with high current values due to elevated operating temperature.

In more detail, the asymmetric excitation can be explained as follows:

In a nominal operation point the current is e.g. 350 mA and the emission spectrum has a characteristic quadruple structure with blue emissions e.g. at 425 nm and 435 nm, and one red (red1) emission peak at 630 nm and another red (red2) emission peak at 660 nm. The said intensity ratio between the blue1:blue2:red1:red2 is in low current state close to e.g. 1:1:2:2. In another set point of operation, also known as the "high current state", the current is tuned up to e.g. 700 mA. Now the other light emitter, namely the sapphire based light emitter shows reduced emission efficiency with relative to vertical type emitter and the characteristic quadruple peak structure changes so that the intensity ratio of the four peaks become close to 2:1.5:4:3. Such spectrum tuning is beneficial for optimizing the artificial lighting conditions for different growth phases of various plants in greenhouse.

In one embodiment, the intensity ratio between a peak in the range of 620 to 640 nm and a corresponding peak in the range from 650 to 670 nm is in the range from about 0.8:1 to 3:1.

In another embodiment, the intensity ratio between said peaks is in the range from about 0.5 to 1.1:1 as a low value of intensity and in the range from about 1.2 to 3:1 at a high value of intensity.

In general the isolated emission areas can be driven via the control interface intermittently to turn on and off, also called later as activation, to provide a light energy pulse of required length. A turn off time, also called later as a delay time or deactivation time, with no light emitting from the emission area can be controlled via the multiple wire control interface. Furthermore, the current control allows deactivation of the emission area for longer periods. Also the current control allows setting of emission frequency of emission area to provide the required spectral density, as required by arbitrary biomass growing application.

Appropriate electrical current control sequence via the control interface allows generating emission spectrum which is varying in time.

Embodiments of the invention provide further interesting features and advantages.

In one preferred embodiment the integrated LED structure provides built-in spectrum adjustability based on a common drive current of asymmetric excitation arrangement. The integrated LED structure is formed of two isolated emission areas in a way that the emission from the first emission area does not influence the emission from the other emission area. In such arrangement of two emission areas the first emission area applies the first type of excitation source and the first type of wavelength conversion material.

Consistently, the second emission area applies the second type of excitation source and the second type of wavelength conversion material. The asymmetric excitation is thus achieved by applying two different types of excitation sources, buried under the wavelength conversion materials in the two isolated emission areas, and connected electrically in series with each other to be able to control them simultaneously with a common drive current.

In a typical case the first wavelength conversion material is a wide band phosphor with excitation maximum near 420 nm and emission maximum near 630 nm, and FWHM of about 100 nm and the second first wavelength conversion material is a wide band phosphor with excitation maximum near 435 nm and emission maximum near 660 nm, and FWHM of about 100 nm.

The first type of the excitation source is a so called vertical light emitting semiconductor diode operating e.g. at 420 nm, and the second type of excitation source is a sapphire based light emitting semiconductor diode operating e.g. at 435 nm.

The two types of the semiconductor diodes have different thermal behavior, and their light output varies independently as a function of junction temperature, which on the other hand depends of the drive current.

Typically the sapphire based semiconductor diode's light output drops faster as a function of rising junction temperature while the vertical semiconductor diode structure is relatively insensitive to junction temperature, as long as the junction temperature is kept within preferred operating range i.e. typically between 45 to 90° C. In a nominal situation the combination of the two semiconductor diode types is driven with a common 300 mA current producing an excitation spectrum at blue wavelengths of 425 and 435 nm (FIG. 4) with a 1:1 intensity ratio between 420 nm and 435 nm. This results in nearly equal emission peaks at 630 and 660 nm from the two phosphors. As the current is increased to 700 mA the efficiency of the sapphire LED drops and the output spectrum changes accordingly while changing the intensity ratio of blue excitation to roughly 1:0.75. This in turn results in an emission intensity ratio of 630 nm and 660 nm to change to 1:0.75.

This characteristic behavior can be applied also gradually by tuning the current continuously or stepwise between 300 mA and 700 mA, thus enabling the adjustment of the said ratio of excitation intensities at 420 nm and 435 nm wavelengths from 1:1 to 1:0.75 and adjusted spectrum of red wavelength bands, following the excitation intensities. So any wanted intensity ratio can be set in a flexible way by adjusting the common drive current.

In another preferred embodiment the integrated LED structure provides built-in spectrum adjustability by applying narrow band phosphors matching the absorption spectrum of chlorophyll A and chlorophyll B.

In one case there are two emission areas, which have different wavelength conversion materials, for example the first emission area has a narrow band phosphor of the first type providing peak output at 630 nm with and the second emission area has a narrow band phosphor of the second type providing peak output at 660 nm (FIG. 5). Such narrow band phosphors could be of e.g. nitridoaluminates based material providing emissions with full width half maximum of typically only 50 nm and their emission spectrum suits particularly well for the excitation of the chlorophyll molecules. In such case the first emission area applies vertical type LED chip and the second emission area applies a sapphire based LED chip. Now it becomes straightforward to adjust the ratio of 630 and 660 nm emission of the integrated LED structure by simply tuning the common drive current.

Narrow bandwidth red phosphors are used for red wavelength area selective excitation of chlorophyll A and chlorophyll B in order to minimize chlorophyll A and chlorophyll B bands over lapping as well to maximize individual chlorophyll A and chlorophyll B absorption band coverage. Narrow bandwidth red phosphor should have emission peak between 600-700 nm and peak's full width half maximum value less than 50 nm but more 25 nm or more preferably less than 50 but more than 35 nm.

The asymmetric excitation and the common current drive method can be applied also in case there is a plurality of isolated emission areas. In such case the number of different type of excitation sources and the number of different type of wavelength conversion materials is not necessarily two.

Furthermore the asymmetric excitation and the common current drive methods can be applied in case there is only one emission area. In such case the number of different type of excitation sources can be e.g. two and the emission area comprises one type of wavelength conversion material.

Figure 2:
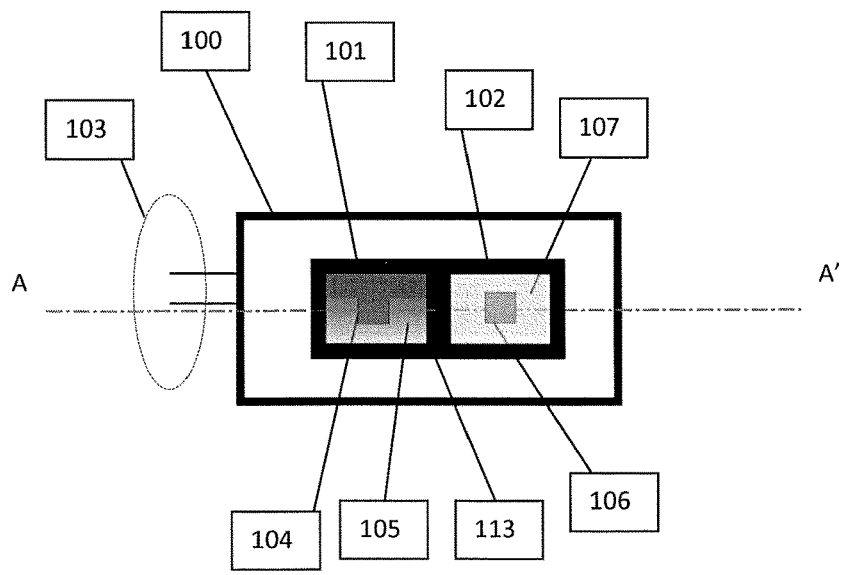
FIG. 2 Is a schematic top side view of an integrated LED structure according to an embodiment of the present invention.

Turning next to the embodiment shown in FIGS. 2 to 5, the following can be noted:

The LED structure is comprised of a substrate 100, two optically non-interacting isolated emission areas 101, and 102, and a two wire control interface 103, see FIG. 2. The first emission area 101 comprises the first type of LED semiconductor chip 104 emitting at 425 nm, and wavelength conversion material 105 having its peak emission at 630 nm and having a full width half maximum (FWHM) emission of about 50 nm. The second emission area 102 comprises a second type of LED semiconductor chip 106 emitting at 438 nm, and wavelength conversion material 107 having its peak emission at 660 nm and having a full width half maximum (FWHM) emission of about 50 nm.

The first LED chip is of vertical type and the second one is of sapphire based LED chip. The control interface is having a two wire structure and is to enable common control of the said two isolated emission areas. The two emitter diodes are connected in series to enable a common drive current control. Thus the cathode of the first emitter diode, located in the first emission area, is connected to the anode of the second emitter diode, located in the second emission area. One electrical contact point of the control interface is electrically connected to the anode of the first emitter diode in the first emission area, and the other electrical contact point is electrically connected to the cathode of the second emitter diode in the second emission area. Thus a close current loop is formed with the said two emitter diodes in series, enabling a common current drive for applying the asymmetric excitation scheme.

The optically independent operation of the two isolated emission areas is achieved by isolating the said first emission area from the second emission area with an optically opaque mesa structure 113, which prevents light emission from the LED emitter 104 located inside of the first emission area 101 to excite the wavelength conversion material 107] inside the said second emission area. The mesa structure 113a is shown in FIG. 3 in the cross section view of the said LED structure.

The first emission area and the second emission areas provide two red wavelength bands centered at 630 and 660 nm and contribute to the total emission spectrum. The emission band centered at 630 nm is used for the excitation of chlorophyll B and emission band centered at 660 nm is used for the excitation of chlorophyll A. The emission spectrum is adjustable and can be controlled by tuning of the common continuous drive current so that the ratio of the 630 and 660 nm intensities vary in scale of 1:1 to 1:0.75. Such magnitude of change can be expected with a current tuning range of 350 mA to 700 mA.

The integrated LED structure described in the previous embodiment can be optionally powered by pulsed source to optimize the excitation of the chlorophyll molecules associated with plants' photosynthesis process. The said LED structure is driven alternately with a pulsed current sequence with a pulse on time period being 0.1 ms and off-time being 2 to 10 ms.

FIGS. 4A, 4B, 5A and 5B were already referred to above. In summary it can be noted that FIGS. 4A and 4B show the nominal emission spectra of LED module with two isolated emission areas comprised of asymmetric excitation emitters at 425 nm and 435 nm driven at common current of 350 mA (left) and 700 mA (right). Emission areas comprise wide band phosphor material with FWHM of about 100 nm. Red emissions are not summed for visualization purposes.

Figures 5A, 5B:
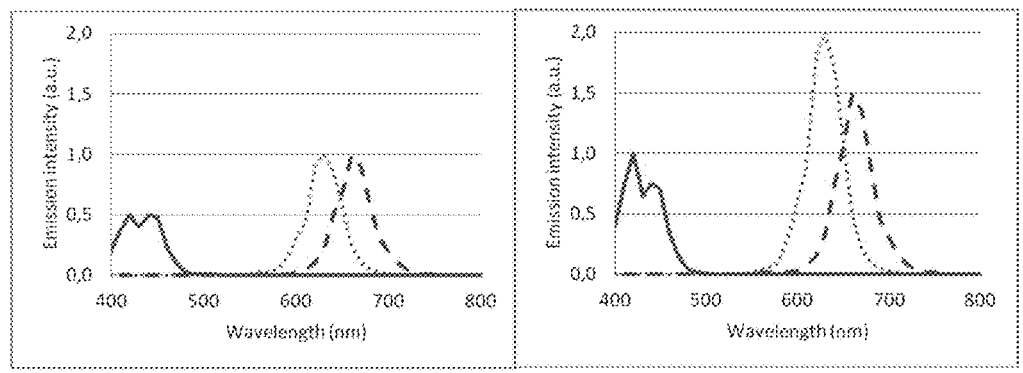
FIGS. 5A and 5B Show graphs representing a typical emission spectrum of an integrated LED structure according to an embodiment of the present invention.

FIGS. 5A and 5B show the nominal emission spectrum of LED module with two isolated emission areas comprised of asymmetric excitation emitters at 425 nm and 435 nm driven at common current of 350 mA (left) and at 700 mA (right). Emission areas comprise narrow band phosphor material with FWHM<60 nm. Red emissions at 630 and 660 nm are not summed for visualization purposes.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics can be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

INDUSTRIAL APPLICABILITY

The present arrangements and methods can be used for providing artificial grow light in greenhouses as well as in other objects in agriculture, horticulture and in biomass growing industry, in particular for meeting the needs of different plants to achieve optimal growth.

REFERENCE SIGNS LIST 100 substrate
101, 102 first and second emission areas
103 wire control interfaces
104 first type of LED semiconductor chip
105, 107 wavelength conversion material
106 second type of LED semiconductor chip
113 optically opaque mesa structure
113a mesa structure

CITATION LIST

Patent Literature

CN103947470A
CN103947469A
WO2013141824A1
WO2009045107A1
JPS6420034A
U.S. Pat. No. 5,012,609
U.S. Pat. No. 5,278,432
WO02067660A1
US2010244724A1
U.S. Pat. No. 8,302,346
CN201797809
CA2856725A1
WO2014188303A1
US2013318869A1
US2014152194A1
US2014034991A1
US2006261742A1

Non-Patent Literature

Vänninen, 2012, Renewable and Sustainable Energy Reviews 13 (2009) 2175-2180
Carvalho et al., 2014, Horticulture Research (2014) 1, 8
Lefsrud et al., 2008 HortScience 43:2243-2244
Beelmann et al., 2009, HAL Project# MU07018
Nicklish_1998_J. Plankton Res.-1998-Nicklisch-105-19
Eytan-1974-J. Biol. Chem.-738-44
Argyroudi-Akoyunoglou-1970_Plant_Physiology_247-9
Sforza et al., 2012, PLoS ONE 7(6): e38975
Olle et al., 2013, Agricultural and Food Science, 22:223-234
Klueter et al., 1980, Transactions of the ASABE. 23 (2): 0437-0442
Yeh, et al. 2009, Renewable and Sustainable Energy Reviews 13: 2175-2180
Tennessen et al., 1995, Photosynthesis Research 44: 261-269

The invention claimed is:

1. A light emitting structure, comprising:
a substrate;
a first light emission area and a second light emission area integrated on the substrate;
a first light emitting semiconductor source mounted in the first light emission area;
a second light emitting semiconductor source mounted in the second light emission area;
an electrical circuit layer configured to serially connect the first and second light emitting semiconductor sources, such that the first and second light emitting semiconductor sources are controllable by a common drive current to cause the first light emitting semiconductor source to emit at a peak of a first wavelength and to cause the second light emitting semiconductor source to emit at a peak of a second wavelength different from the first wavelength;
a first wavelength conversion layer in the first light emission area and formed on the first light emitting semiconductor source, wherein the first wavelength conversion material is configured to emit at a peak of a third wavelength; and
a second wavelength conversion layer in the second light emission area and formed on the second light emitting semiconductor source, wherein the second wavelength conversion material is configured to emit at a peak of a fourth wavelength different from the third wavelength.

2. The light emitting structure of claim 1, wherein the first light emission area and the second light emission area respectively comprise first and second cavities in the substrate.

3. The light emitting structure of claim 1, wherein the first light emission area and the second light emission area are arranged on a top surface of the substrate.

4. The light emitting structure of claim 3, wherein the first light emission area and the second light emission area are optically isolated from each other by an opaque structure formed on the top of the substrate.

5. The light emitting structure of claim 3, wherein the electrical circuit layer is formed on the top surface of the substrate.

6. The light emitting structure of claim 1, further comprising a polarizer covering at least one of the first light emission area or the second light emission area.

7. The light emitting structure of claim 1, wherein the first and second light emitting semiconductor sources have different current-to-light conversion characteristics.

8. The light emitting structure of claim 1, wherein the first light emitting semiconductor source comprises a vertical semiconductor diode, and wherein the second light emitting semiconductor source comprises a sapphire based semiconductor diode.

9. The light emitting structure of claim 1, wherein the third wavelength is between 620 and 640 nm, and wherein the fourth wavelength is between 650 and 670 nm.

10. The light emitting structure of claim 1, wherein the first and second wavelengths are between 365 to 440 nm.

11. The light emitting structure of claim 1, wherein the light emitting structure is configured to produce an emission spectrum in response to the common drive current, the emission spectrum comprising a peak at the third wavelength and a peak at the fourth wavelength.

12. The light emitting structure of claim 11, wherein the peak at the third wavelength in the emission spectrum is configured to excite chlorophyll B, and wherein the peak at the fourth wavelength in the emission spectrum is configured to excite chlorophyll A.

13. The light emitting structure of claim 11, further comprising an electrical control interface configured to supply the common drive current, wherein the electrical control interface is configured to adjust a magnitude of the common drive current between a first value and a second value.

14. The light emitting structure of claim 13, wherein at the first value a ratio of an intensity of the peak at the third wavelength in the emission spectrum and an intensity of the peak at the fourth wavelength in the emission spectrum is a first ratio, and wherein at the second value a ratio of the intensity of the peak at the third wavelength in the emission spectrum and the intensity of the peak at the fourth wavelength in the emission spectrum is a second ratio different from the first ratio.

15. The light emitting structure of claim 1, further comprising an electrical control interface configured to supply the common drive current as a pulsed current.

16. The light emitting structure of claim 1, wherein the first and second light emission areas are optically isolated from each other.

17. A light emitting structure, comprising:
a substrate;
a first light emission area and a second light emission area integrated on the substrate, wherein the first and second light emission areas are optically isolated from each other;
a first light emitting semiconductor source mounted in the first light emission area;
a second light emitting semiconductor source mounted in the second light emission area;
an electrical circuit layer configured to serially connect the first and second light emitting semiconductor sources, such that the first and second light emitting semiconductor sources are controllable by a common drive current to cause the first and second light emitting semiconductor sources to emit;
a first wavelength conversion layer in the first light emission area and formed on the first light emitting semiconductor source, wherein the first wavelength conversion material is configured to emit at a peak of a first wavelength; and
a second wavelength conversion layer in the second light emission area and formed on the second light emitting semiconductor source, wherein the second wavelength conversion material is configured to emit at a peak of a second wavelength different from the first wavelength.

18. The light emitting structure of claim 17, wherein the first light emission area and the second light emission area respectively comprise first and second cavities in the substrate.

19. The light emitting structure of claim 17, wherein the first light emission area and the second light emission area are optically isolated from each other by an opaque structure formed on the top of the substrate.

20. The light emitting structure of claim 17, wherein the first and second light emitting semiconductor sources have different current-to-light conversion characteristics.

21. The light emitting structure of claim 17, wherein the first and second light emitting semiconductor sources are of different types.

22. The light emitting structure of claim 21, wherein the first light emitting semiconductor source comprises a vertical semiconductor diode, and wherein the second light emitting semiconductor source comprises a sapphire based semiconductor diode.

23. The light emitting structure of claim 17, wherein the first wavelength is between 620 and 640 nm, and wherein the second wavelength is between 650 and 670 nm.

24. The light emitting structure of claim 17, wherein the light emitting structure is configured to produce an emission spectrum in response to the common drive current, the emission spectrum comprising a peak at the first wavelength and a peak at the second wavelength.

25. The light emitting structure of claim 24, wherein the peak at the first wavelength in the emission spectrum is configured to excite chlorophyll B, and wherein the peak at the second wavelength in the emission spectrum is configured to excite chlorophyll A.

26. The light emitting structure of claim 24, further comprising an electrical control interface configured to supply the common drive current, wherein the electrical control interface is configured to adjust a magnitude of the common drive current between a first value and a second value.

27. The light emitting structure of claim 26, wherein at the first value a ratio of an intensity of the peak at the first wavelength in the emission spectrum and an intensity of the peak at the second wavelength in the emission spectrum is a first ratio, and wherein at the second value a ratio of the intensity of the peak at the first wavelength in the emission spectrum and the intensity of the peak at the second wavelength in the emission spectrum is a second ratio different from the first ratio.

* * * * *